US012805342B2

(12) United States Patent
Liu et al.

(10) Patent No.: US 12,805,342 B2
(45) Date of Patent: Nov. 17, 2026

(54) MANUFACTURING METHOD OF SEMICONDUCTOR PACKAGING MEMBER, SEMICONDUCTOR PACKAGING MEMBER AND MOUNTING METHOD THEREOF

(71) Applicant: JCET SEMICONDUCTOR (SUQIAN) CO., LTD., Suqian City (CN)

(72) Inventors: Kai Liu, Suqian City (CN); Yaqin Wang, Suqian City (CN)

(73) Assignee: JCET SEMICONDUCTOR (SUQIAN) CO., LTD., Suqian City (CN)

( * ) Notice: Subject to any disclaimer, the term of this patent is extended or adjusted under 35 U.S.C. 154(b) by 640 days.

(21) Appl. No.: 18/099,931

(22) Filed: Jan. 21, 2023

(65) Prior Publication Data

US 2023/0411252 A1 Dec. 21, 2023

(30) Foreign Application Priority Data

Jun. 20, 2022 (CN) ......................... 202210700681.7

(51) Int. Cl.
*H10W 70/40* (2026.01)
*H10W 72/00* (2026.01)
(Continued)

(52) U.S. Cl.
CPC ........ *H10W 70/424* (2026.01); *H10W 72/884* (2026.01); *H10W 74/40* (2026.01); *H10W 90/756* (2026.01)

(58) Field of Classification Search
CPC ......... H01L 23/49513; H01L 23/49541; H01L 23/49575; H01L 23/49582; H10W 90/811;
(Continued)

(56) References Cited

U.S. PATENT DOCUMENTS

2006/0138615 A1* 6/2006 Sato .................... H10W 70/424 257/667
2016/0163622 A1* 6/2016 Liang ...................... H10P 14/46 257/676
(Continued)

FOREIGN PATENT DOCUMENTS

CN 105470232 A 4/2016
CN 207834289 U 9/2018
(Continued)

*Primary Examiner* — Monica D Harrison
*Assistant Examiner* — Jacob T Nelson
(74) *Attorney, Agent, or Firm* — MUNCY, GEISSLER, OLDS & LOWE, P.C.

(57) ABSTRACT

The present invention provides a manufacturing method of a semiconductor packaging member, a semiconductor packaging member and a mounting method thereof. The manufacturing method includes the following steps of: pre-molding packaging a lead frame, forming a pre-molding package body both between a lead and a base, and between two adjacent leads in each lead frame unit; forming a groove by thinning an outer lead from a front surface of the outer lead; forming a tin block in the groove; mounting a chip on the base island; plastic-packaging the lead frame which has completed the wire-bonded; forming a semifinished product by forming a tin-plated layer in an exposed region of a back surface of the plastic-packaged lead frame; and forming a single semiconductor packaging member by cutting the semifinished product, the tin block in the semiconductor packaging member is exposed away from the base island.

11 Claims, 3 Drawing Sheets

(51) Int. Cl.
*H10W 74/40* (2026.01)
*H10W 90/00* (2026.01)

(58) Field of Classification Search
CPC .. H10W 70/424; H10W 70/481; H10W 70/40
See application file for complete search history.

(56) References Cited

U.S. PATENT DOCUMENTS

| | | | | |
|---|---|---|---|---|
| 2020/0402893 | A1* | 12/2020 | Chang | H01L 23/49548 |
| 2020/0411417 | A1* | 12/2020 | Talledo | H01L 24/32 |
| 2022/0301986 | A1* | 9/2022 | Yamaguchi | H01L 23/49544 |

FOREIGN PATENT DOCUMENTS

| | | | | |
|---|---|---|---|---|
| CN | 108987367 | A | | 12/2018 |
| CN | 109256367 | A | | 1/2019 |
| CN | 111987002 | A | | 11/2020 |
| CN | 213936184 | U | | 8/2021 |
| JP | 3008470 | | * | 12/1999 |

* cited by examiner

MANUFACTURING METHOD OF SEMICONDUCTOR PACKAGING MEMBER, SEMICONDUCTOR PACKAGING MEMBER AND MOUNTING METHOD THEREOF

TECHNICAL FIELD

The present invention relates to the field of semiconductor packaging, and in particular to a manufacturing method of a semiconductor packaging member, a semiconductor packaging member and a mounting method thereof.

BACKGROUND

As shown in FIG. 1, in the traditional no-lead packaging, a base island 12' and part of a back surface of a lead 11' exposed from a plastic package 4' may be electroplated with tin in an electroplating process to form a tin-plated layer 5'. After a single semiconductor packaging member 20' is formed by cutting, a cutting surface of the lead 11' is exposed from the plastic package 4', and is a bare copper surface. When the semiconductor packaging member 20' is soldered on a circuit board 30', the bottom mounting surface with the tin-plated layer 5' has a certain amount of tinning, while the cutting surface without tinning has almost no tinning, resulting in an insufficient solder around the lead, and failing to satisfy solder requirements of automobile products and AOI detection standards.

In view of this, in order to solve the above problems, it is necessary to provide a manufacturing method of a semiconductor packaging member, a semiconductor packaging member and a mounting method thereof.

SUMMARY

An object of the present invention is to provide a manufacturing method of a semiconductor packaging member, a semiconductor packaging member and a mounting method thereof.

In order to achieve the above object of the present invention, the following technical solutions are adopted by the present invention: A manufacturing method of a semiconductor packaging member, comprising the following steps of:

- Pre-molding packaging a lead frame, forming a pre-molding package body both between a lead and a base island, and between two adjacent leads in each lead frame unit;
- forming a groove by thinning an outer lead from a front surface of the outer lead;
- forming a tin block in the groove;
- mounting a chip on the base island, and performing wire bonding between the chip and an inner lead;
- plastic-packaging the lead frame which has completed the wire-bonded;
- forming a semifinished product by forming a tin-plated layer in an exposed region of a back surface of the plastic-packaged lead frame; and forming a single semiconductor packaging member by cutting the semifinished product, the tin block in the semiconductor packaging member is exposed outwardly on the side away from the base island.

As a further improved technical solution of the present invention, forming the tin block in the groove specifically comprises the following step of: forming the tin block by reflowing solder paste after the groove is filled with the solder paste.

As a further improved technical solution of the present invention, mounting the chip on the base island refers to mounting the chip on the base island with the solder paste; and forming the tin block in the groove and mounting the chip on the base island specifically comprise: filling the groove with the solder paste while applying the solder paste on the base island; and reflowing the solder paste after mounting the chip on the base island, and forming the tin block in the groove while mounting the chip on the base island.

As a further improved technical solution of the present invention, forming the groove by thinning the outer lead from the front surface of the outer lead specifically refers to forming the groove by thinning the outer lead from the front surface of the outer lead through half etching.

As a further improved technical solution of the present invention, while thinning the outer lead from the front surface of the outer lead, thinning a lead connecting rib connected to the outer lead from the front surface of the lead connecting rib to form the groove.

As a further improved technical solution of the present invention, the grooves on two opposing outer leads in two adjacent lead frame units are communicated with each other.

As a further improved technical solution of the present invention, forming the single semiconductor packaging member by cutting the semifinished product refers to forming the single semiconductor packaging member by cutting the semifinished product from the location of the lead connecting rib.

As a further improved technical solution of the present invention, the groove is a rectangular groove or an arc-shaped groove.

The present invention further provides a semiconductor packaging member, the semiconductor packaging member is manufactured by the manufacturing method of a semiconductor packaging member as described above.

The present invention further provides a semiconductor packaging member, comprising a lead frame unit, the lead frame unit having a base island and leads located around the base island, the lead comprising an inner lead and an outer lead; the front surface of the outer lead is lower than the front surface of the inner lead, the lead frame unit further comprising a tin block located on the front surface of the outer lead, and the side of the tin block away from the base island is exposed.

As a further improved technical solution of the present invention, the semiconductor packaging member further comprising a pre-molding package body located between the base island and the lead and between two adjacent leads, the front surface of the outer lead, the pre-molding package body and the inner lead jointly form a groove, and the tin block is located in the groove.

As a further improved technical solution of the present invention, the semiconductor packaging member further comprising a chip mounted on the base island, a bonding wire connected between the chip and the inner lead, a plastic package for packaging the chip and the bonding wire, and a tin-plated layer formed on the base island and the back surface of the lead.

The present invention further provides a mounting method of a semiconductor packaging member, comprising the following step of: soldering the semiconductor packaging member on a circuit board, the tin block on the outer lead is melted during soldering, and the side of the partially melted tin block away from the base island is connected to the tin-plated layer on the back surface of the lead.

The present invention has the following technical effects. In the manufacturing method of a semiconductor packaging member of the present invention, by pre-molding packaging a lead frame; after the entire front surface of an outer lead is removed, a larger volume of the groove can be enclosed, enabling a greater amount of solder paste to be filled within the groove. Thus, when the semiconductor packaging member is soldered on a circuit board subsequently, after the tin block is melted, a sufficient amount of solder paste can flow downward from one side of the lead away from the base island to be connected to the tin-plated layer on a back surface of the lead, such that all-position soldering from a front surface to side surfaces and then the back surface of the lead can be realized, thereby improving the reliability of a circuit, and effectively improving the stability and the pass rate in AOI detection.

BRIEF DESCRIPTION OF THE DRAWINGS

FIG. 2(*b*) is a section view of FIG. 2(*a*) at A-A;

FIG. 6(*b*) is a section view of FIG. 6(*a*) at B-B;

DETAILED DESCRIPTION

Figure 1:
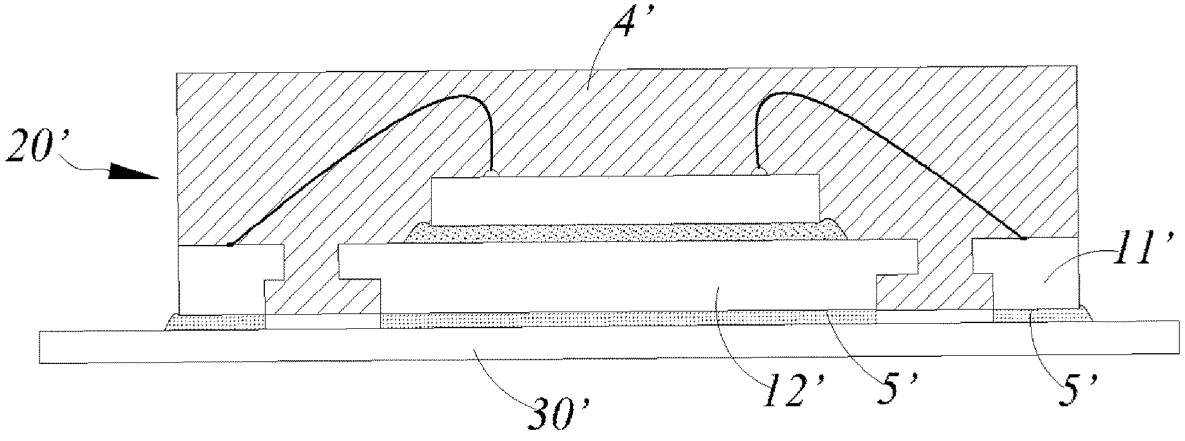
FIG. 1 (Prior Art)
FIG. 1 is a schematic structural diagram of a semiconductor packaging member installed onto a circuit board in the prior art.
Figure 2A:
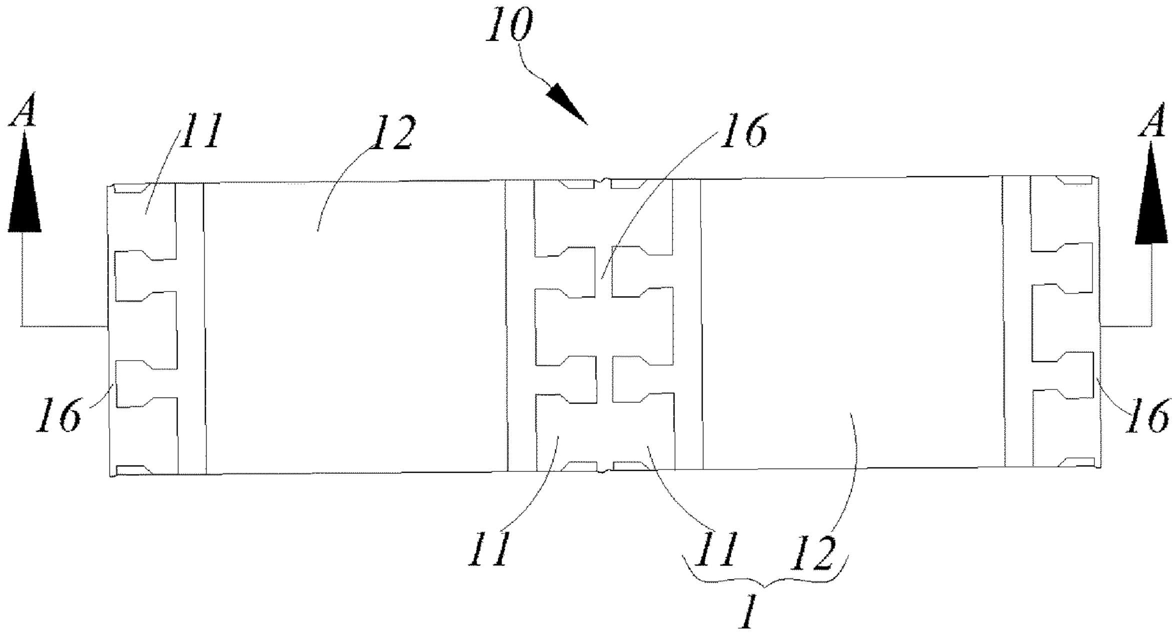
FIG. 2(*a*) is a top view of a lead frame.
Figure 2B:
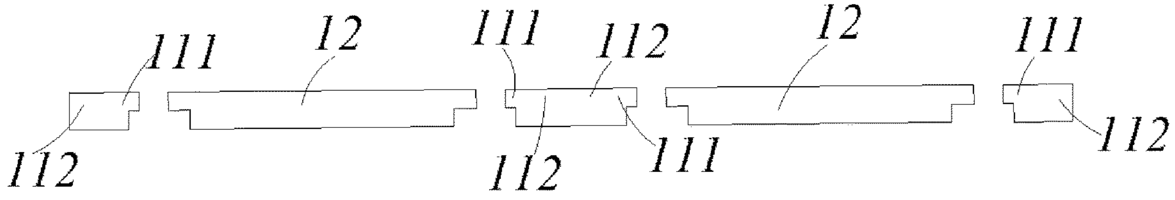

The present invention will be described in detail below with reference to various embodiments shown in the accompanying drawings. Referring to FIGS. 2(*a*) to 9, which are preferred embodiments of the present invention. However, it should be noted that these embodiments do not limit the present invention, and functions, methods or structural equivalents or substitutions made by those of ordinary skills in the art according to these embodiments shall all fall within the protection scope of the present invention.

Figure 3:
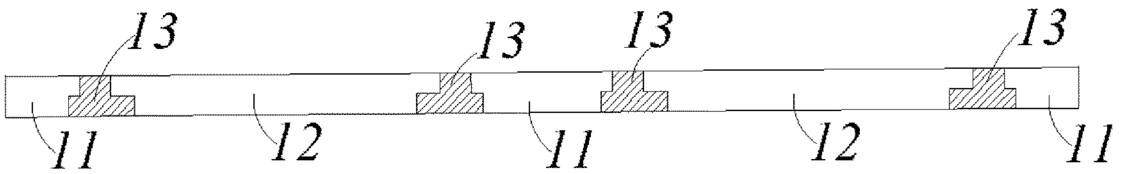
FIG. 3 is a section view of the lead frame in FIG. 2 after plastic packaging.
Figure 4:
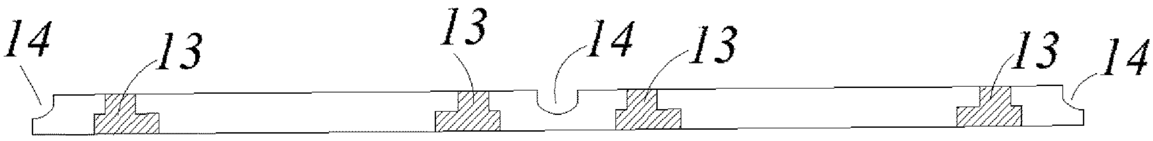
FIG. 4 is a section view of the lead frame in FIG. 3 after a groove is formed.
Figure 5:
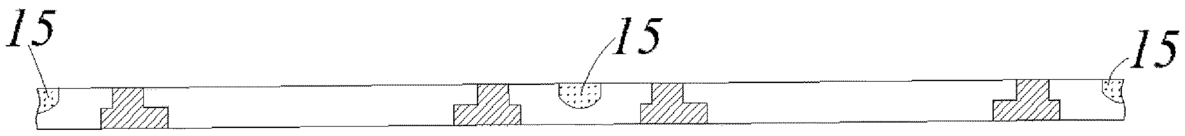
FIG. 5 is a section view after a tin block formed in the groove in FIG. 4.
Figure 6A:
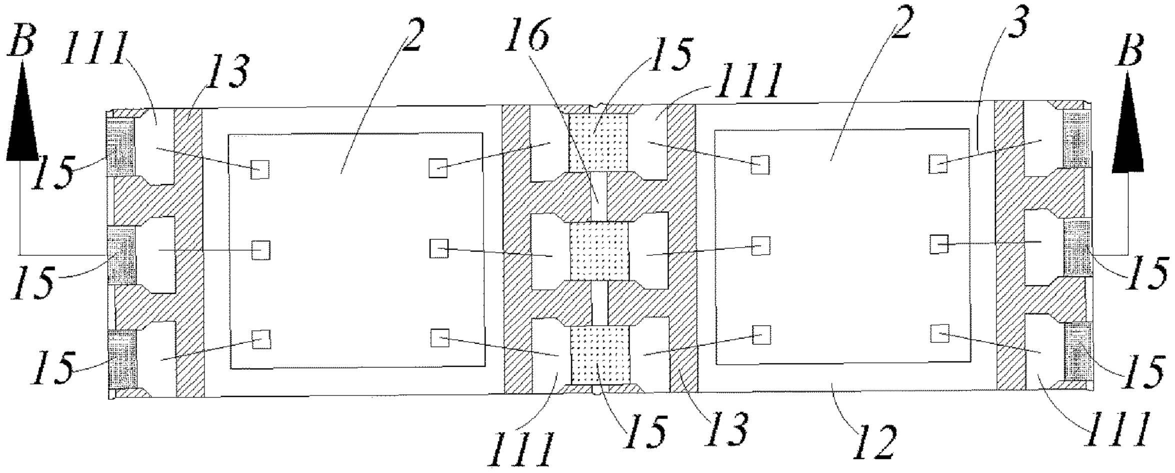
FIG. 6(*a*) is a schematic structural diagram of the lead frame in FIG. 4 that is mounted with a chip and wire-bonded.
Figure 6B:
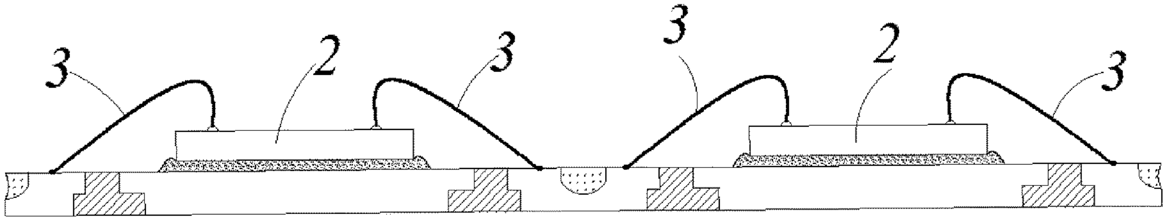
Figure 7:
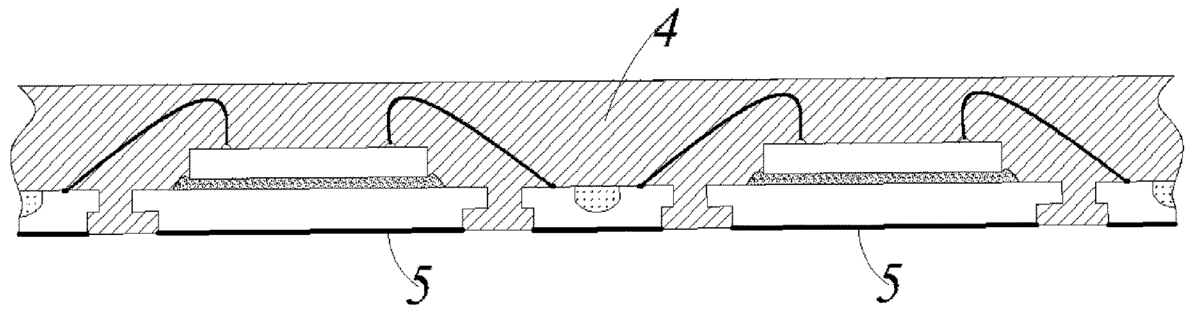
FIG. 7 is a section view of a semifinished product formed after the lead frame in FIG. 6 is plastic-packaged and a tin-plated layer is formed.
Figure 8:
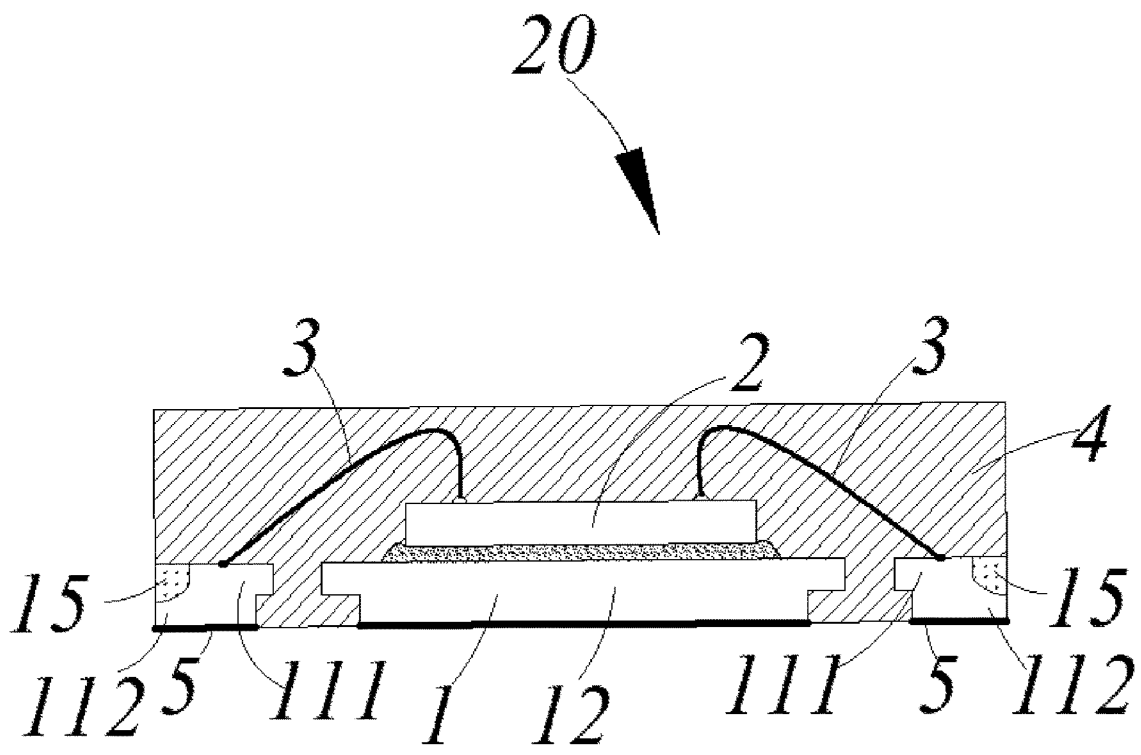
FIG. 8 is a section view of a semiconductor packaging member formed by cutting the semifinished product in FIG. 7.

FIGS. 2(*a*) to 8 are flowcharts of steps of a manufacturing method of a semiconductor packaging member 20 according to a specific embodiment. The manufacturing method includes the following steps of:

- pre-molding packaging a lead frame 10 in FIGS. 2(*a*) and 2(*b*), and forming a pre-molding package body 13 as shown in FIG. 3 both between a lead 11 and a base island 12, and between two adjacent leads 11 in each lead frame unit 1;
- as shown in FIG. 4, forming a groove 14 by thinning an outer lead 112 from a front surface of the outer lead 112;
- as shown in FIG. 5, forming a tin block 15 in the groove 14;
- as shown in FIGS. 6(*a*) and 6(*b*), mounting a chip 2 on the base island 12, and performing wire bonding between the chip 2 and an inner lead 111;
- as shown in FIG. 7, plastic-packaging the lead frame 10 which has completed the wire-bonded;
- forming a semifinished product shown in FIG. 7 by forming a tin-plated layer 5 in an exposed region on a back surface of the plastic-packaged lead frame 10; and
- as shown in FIG. 8, forming a single semiconductor packaging member 20 by cutting the semifinished product, the tin block 15 in the semiconductor packaging member 20 is exposed outwardly on the side away from the base island 12.

In the present invention, by pre-molding packaging the lead frame 10; after the entire front surface of the outer lead 112 is removed, a larger volume of the groove 14 can be enclosed, wherein the pre-molding package body 13 located around the outer lead 112 can form part of walls of the groove 14 in a surrounding manner. Then, followed by forming the tin block 15 in the groove 14, the solder paste cannot flow out, thereby forming the tin block 15 with a preset height and filling the groove 14 with more solder paste. Thus, when the semiconductor packaging member 20 is soldered on a circuit board 30 subsequently, after the tin block 15 is melted, a sufficient amount of solder paste can flow downward from one side of the lead 11 away from the base island 12 to be connected to the tin-plated layer 5 on a back surface of the lead 11, such that all-position soldering from a front surface to side surfaces and then the back surface of the lead 11 can be realized, thereby improving the reliability of a circuit, and effectively improving the stability and the pass rate in AOI detection. Further, when the semiconductor packaging member 20 is soldered on the circuit board 30, the tin block 15 provided in advance can flow vertically to a pad of the circuit board 30 based on the principle of potential energy, thereby reducing power consumption and saving more energy.

Specifically, a front surface of the formed pre-molding package body 13 is flush with front surfaces of the base island 12 and the lead 11, such that the pre-molding package body 13 located around the outer lead 112 can form part of walls of the groove 14 in a surrounding manner after the outer lead 112 is thinned from the front surface of the outer lead 112 subsequently. Thus, when the tin block 15 is formed in the groove 14 subsequently, the solder paste cannot flow out, thereby forming the tin block 15 with the preset height.

It is known that the preset height of the tin block 15 refers to the depth of the groove 14.

Further, pre-molding packaging the lead frame 10, and forming the pre-molding package body 13 both between the lead 11 and the base island 12, and between two adjacent leads 11 in each lead frame unit 1 specifically includes the following steps of:

- injecting the molding compound into the equipment, pre-molding packaging the lead frame 10, filling the molding compound into each lead frame unit 1 both between the lead 11 and the base island 12, and between two adjacent leads 11; and
- forming the pre-molding package body 13 by performing a curing operation after pre-molding packaging.

In a specific embodiment, forming the groove 14 by thinning the outer lead 112 from the front surface of the outer lead 112 specifically refers to forming the groove 14 by thinning the outer lead 112 from the front surface of the outer lead 112 through half etching. Certainly, the present invention is not limited thereto.

Specifically, the groove 14 may be a rectangular groove 14 or an arc-shaped groove 14. Certainly, the specific shape of the groove 14 is not limited thereto and may be changed according to specific requirements.

As shown in FIG. 6(*a*), the lead frame 10 further includes a lead connecting rib 16 connecting the outer leads 112 in two adjacent lead frame units 1. While thinning the outer lead 112 from the front surface of the outer lead 112, thinning the lead connecting rib 16 connected to the outer lead 112 from the front surface of the lead connecting rib 16, so as to form the groove 14. That is, the groove 14 extends beyond the side of the outer lead 112 away from the base island 12 to ensure that the side of the tin block 15 that is in the groove 14 away from the base island 12 is completely exposed after the subsequent cutting. When the semiconductor packaging member 20 is soldered on the circuit board 30, more of the melted tin block 15 can flow downward to be soldered on the pad of the circuit board 30, thereby improving the reliability of the circuit.

Further, the grooves 14 on two opposing outer leads 112 in two adjacent lead frame units 1 are communicated with each other, thereby simplifying the process of forming the tin block 15 in the groove 14, and improving the efficiency.

Further, forming the single semiconductor packaging member 20 by cutting the semifinished product refers to forming the single semiconductor packaging member 20 by cutting the semifinished product from the location of the lead connecting rib 16. After cutting, the side of the tin block 15 away from the base island 12 can be completely exposed. When the semiconductor packaging member 20 is soldered on the circuit board 30, more of the melted tin block 15 can flow downward to be soldered on the pad of the circuit board 30, such that all-position soldering from the front surface to the side surfaces and then the back surface of the lead 11 can be realized, thereby improving the reliability of the circuit, and effectively improving the stability and the pass rate in AOI detection.

Further, forming the tin block 15 in the groove 14 specifically includes the following step of: forming the tin block 15 by reflowing solder paste after the groove 14 is filled with the solder paste. The solder paste is reflowed to be soldered with the lead frame 10 so as to form the tin block 15 without affecting the strength of the lead frame 10 or the transfer of post-process operations.

Particularly, specific parameters in the reflowing process may be parameters in the existing reflowing process, as long as the groove 14 is filled with the solder paste and the tin block 15 can be formed.

As shown in FIGS. 5 and 6, in this embodiment, forming the tin block 15 by reflowing the solder paste in the groove 14 and mounting the chip 2 on the base island 12 may be completed separately. That is, the tin block 15 is firstly formed by filling the groove 14 with the solder paste and then reflowing the solder paste; and then, the chip 2 is mounted on the base island 12. The surface mounted technology (SMT) process of mounting the chip 2 on the base island 12 may follow the existing SMT process, which is not limited. Certainly, the present invention is not limited thereto, in the embodiment in which mounting the chip 2 on the base island 12 refers to mounting the chip 2 on the base island 12 with the solder paste, forming the tin block 15 in the groove 14 and mounting the chip 2 on the base island 12 may also be set as follows: filling the groove 14 with the solder paste when applying the solder paste on the base island 12; and reflowing the solder paste after mounting the chip 2 on the base island 12, forming the tin block 15 in the groove 14 while mounting the chip 2 on the base island 12. That is, the base island 12 and the groove 14 are filled with the solder paste simultaneously, and then the solder paste is reflowed simultaneously, such that the tin block 15 is formed in the groove 14 while the chip 2 is mounted on the base island 12. Therefore, the process is simplified, and the cost is reduced.

Specifically, the processes of performing wire bonding between the chip 2 and the inner lead 111, plastic-packaging the lead frame 10 which has completed the wire-bonded, and forming the semifinished product by forming the tin-plated layer 5 in the exposed region on the back surface of the plastic-packaged lead frame 10 in the manufacturing method of a semiconductor packaging member of the present invention may follow the existing processes, and will not be repeated herein.

Further, the present invention further provides a semiconductor packaging member 20 manufactured by the above manufacturing method. The manufacturing method of the semiconductor packaging member 20 is described above, and will not be repeated herein.

As shown in FIG. 8, the semiconductor packaging member 20 includes a lead frame unit 1, the lead box unit 1 having a base island 12 and leads 11 located around the base island 12, the lead 11 comprising an inner lead 111 and an outer lead 112; and the front surface of the outer lead 112 is lower than the front surface of the inner lead 111, the lead frame unit 1 further comprising a tin block 15 located on the front surface of the outer lead 112, and the side of the tin block 15 away from the base island 12 is exposed. In the semiconductor packaging member 20 of the present invention, the entire front surface of the outer lead 112 is removed, such that more solder paste can be pre-received on the front surface of the outer lead 112. Thus, when the semiconductor packaging member 20 is soldered on a circuit board 30 subsequently, the tin block 15 is melted, a sufficient amount of solder paste can flow downward from the side of the lead 11 away from the base island 12 to be connected to the tin-plated layer 5 on the back surface of the lead 11, such that all-position soldering from the front surface to side surfaces and then the back surface of the lead 11 can be realized, thereby improving the reliability of the circuit, and effectively improving the stability and the pass rate in AOI detection. Further, when the semiconductor packaging member 20 is soldered on the circuit board 30, the tin block 15 provided in advance can flow vertically to a pad of the circuit board 30 based on the principle of potential energy, thereby reducing power consumption and saving more energy.

As shown in FIGS. 3 to 5, the semiconductor packaging member 20 further comprising a pre-molding package body 13 located between the base island 12 and the lead 11 and between two adjacent leads 11, the front surface of the outer lead 112, the pre-molding package body 13 and the inner lead 111 jointly form the groove 14, and the tin block 15 is located in the groove 14. It is known that the pre-molding package body 13 located around the outer lead 112 can form part of walls of the groove 14 in a surrounding manner. Thus, when the tin block 15 is formed in the groove 14 subsequently, the solder paste cannot flow out, thereby forming the tin block 15 with a preset height.

Specifically, the groove 14 may be a rectangular groove 14 or an arc-shaped groove 14. Certainly, the specific shape of the groove 14 is not limited thereto and may be changed according to specific requirements.

The semiconductor packaging member 20 further comprising a chip 2 mounted on the base island 12, a bonding wire 3 connected between the chip 2 and the inner lead 111, a plastic package body 4 for packaging the chip 2 and the bonding wire 3, and a tin-plated layer 5 formed on the base island 12 and the back surface of the lead 11.

Figure 9:
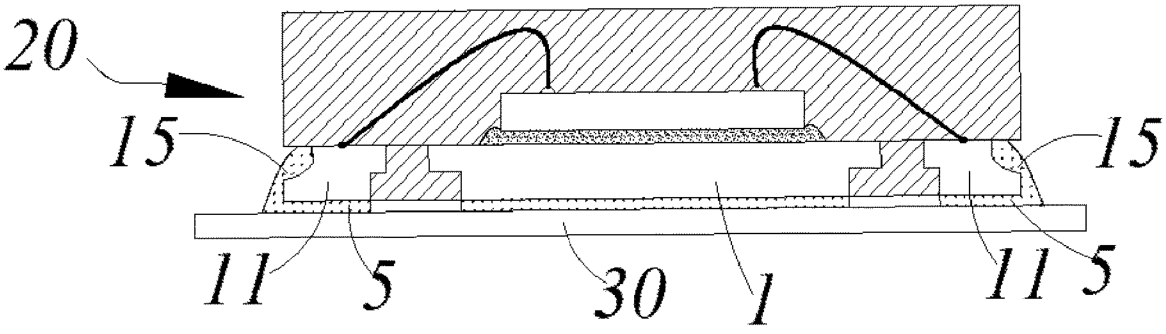
FIG. 9 is a section view of the semiconductor packaging member according to the present invention which has been installed onto a circuit board.

Further, as shown in FIG. 9, the present invention further provides a mounting method of a semiconductor packaging member 20, including the following step of: soldering the above semiconductor packaging member 20 on the circuit board 30. During soldering, the tin block 15 on the outer lead 112 is melted, and the side of the partially melted tin block 15 away from the base island 12 is connected to the tin-plated layer 5 on the back surface of the lead 11. It is known that the partially melted tin block 15 can flow downward to the pad of the circuit board 30, such that all-position soldering from the front surface to the side surfaces and then the back surface of the lead 11 can be realized, thereby improving the reliability of the circuit, and effectively improving the stability and the pass rate in AOI detection.

Compared with the prior art, in the manufacturing method of the semiconductor packaging member 20 of the present invention, by pre-molding packaging the lead frame 10; after the entire front surface of the outer lead 112 is removed, a larger volume of the groove 14 can be enclosed, and filled with more solder paste in the groove 14. Thus, when the semiconductor packaging member 20 is soldered on the circuit board 30 subsequently, after the tin block 15 is melted, a sufficient amount of solder paste can flow downward from the side of the lead 11 away from the base island 12 to be connected to the tin-plated layer 5 on the back surface of the lead 11, such that all-position soldering from the front surface to the side surfaces and the back surface of the lead 11 can be realized, thereby improving the reliability of the circuit, and effectively improving the stability and the pass rate in AOI detection.

It should be understood that although the present invention is described in terms of embodiments in this description, not every embodiment includes only one independent technical solution. The statement mode of the description is merely for clarity, and those skilled in the art should regard the description as a whole. The technical solutions in various embodiments may also be combined properly to develop other embodiments understandable by those skilled in the art.

A series of detailed descriptions listed above are merely for specifically illustrating the feasible embodiments of the present invention, but not intended to limit the protection scope of the present invention. Any equivalent embodiments or variations made without departing from the technical spirit of the present invention shall fall within the protection scope of the present invention.

What is claimed is:

1. A manufacturing method of a semiconductor packaging member, comprising the following steps of:

pre-molding packaging a lead frame, forming a pre-molding package body both between a lead and a base island, and between two adjacent leads in each lead frame unit, wherein a front surface of the formed pre-molding package body is flush with a front surfaces of the base island and the lead;

forming a groove by thinning an outer lead from a front surface of the outer lead through half etching, wherein the pre-molding package body located around the outer lead can form part of walls of the groove in a surrounding manner;

forming a tin block in the groove;

mounting a chip on the base island, and performing wire bonding between the chip and an inner lead;

plastic-packaging the lead frame which has completed the wire bonding;

forming a semifinished product by forming a tin-plated layer in an exposed region of a back surface of the plastic-packaged lead frame; and forming a single semiconductor packaging member by cutting the semifinished product, the tin block in the semiconductor packaging member is exposed outwardly on a side away from the base island.

2. The manufacturing method of the semiconductor packaging member according to claim 1, wherein forming the tin block in the groove specifically comprises the following step of: forming the tin block by reflowing solder paste after the groove is filled with the solder paste.

3. The manufacturing method of the semiconductor packaging member according to claim 1, wherein mounting the chip on the base island refers to mounting the chip on the base island with solder paste; and forming the tin block in the groove and mounting the chip on the base island specifically comprise:

filling the groove with the solder paste while applying the solder paste on the base island; and reflowing the solder paste after mounting the chip on the base island, and forming the tin block in the groove while mounting the chip on the base island.

4. The manufacturing method of the semiconductor packaging member according to claim 1, wherein while thinning the outer lead from the front surface of the outer lead, thinning a lead connecting rib connected to the outer lead from the front surface of the lead connecting rib to form the groove.

5. The manufacturing method of the semiconductor packaging member according to claim 4, wherein grooves on two opposing outer leads in two adjacent lead frame units are communicated with each other.

6. The manufacturing method of the semiconductor packaging member according to claim 4, wherein forming the single semiconductor packaging member by cutting the semifinished product refers to forming the single semiconductor packaging member by cutting the semifinished product from the location of the lead connecting rib.

7. The manufacturing method of the semiconductor packaging member according to claim 1, wherein the groove is a rectangular groove or an arc-shaped groove.

8. A semiconductor packaging member, the semiconductor packaging member manufactured by the method of claim 1, the semiconductor packaging member comprising a lead frame unit, the lead frame unit having a base island and leads located around the base island, the leads comprising an inner lead and an outer lead; wherein a front surface of the outer lead is lower than a front surface of the inner lead, the lead frame unit further comprising a tin block located on the front surface of the outer lead, and a side of the tin block away from the base island is exposed.

9. The semiconductor packaging member according to claim 8, wherein the semiconductor packaging member further comprising a pre-molding package body located between the base island and the leads and between two adjacent leads, the front surface of the outer lead, the pre-molding package body and the inner lead jointly form a groove, and the tin block is located in the groove.

10. The semiconductor packaging member according to claim 9, wherein the semiconductor packaging member further comprising a chip mounted on the base island, a bonding wire connected between the chip and the inner lead, a plastic package for packaging the chip and the bonding wire, and a tin-plated layer formed on the base island and a back surface of the lead.

11. A mounting method of a semiconductor packaging member, comprising the following step of: soldering the semiconductor packaging member according to claim 8 on a circuit board, wherein the tin block on the outer lead is melted during soldering, and a side of the partially melted tin block away from the base island is connected to a tin-plated layer on the back surface of the lead.

* * * * *